(12) United States Patent
Lai

(10) Patent No.: US 10,170,907 B2
(45) Date of Patent: Jan. 1, 2019

(54) DYNAMIC ESD PROTECTION SCHEME

(71) Applicant: Taiwan Semiconductor Manufacturing Co., Ltd., Hsin-Chu (TW)

(72) Inventor: Ming-Fang Lai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 210 days.

(21) Appl. No.: 15/242,697

(22) Filed: Aug. 22, 2016

(65) Prior Publication Data

US 2017/0346278 A1 Nov. 30, 2017

Related U.S. Application Data

(60) Provisional application No. 62/343,285, filed on May 31, 2016.

(51) Int. Cl.
*H02H 9/04* (2006.01)
*H01L 29/40* (2006.01)
*H01L 27/02* (2006.01)

(52) U.S. Cl.
CPC ......... *H02H 9/045* (2013.01); *H01L 27/0259* (2013.01); *H01L 29/404* (2013.01)

(58) Field of Classification Search
CPC ... H02H 9/045; H01L 27/0262; H01L 28/404; H01L 27/0259; H01L 29/404
See application file for complete search history.

(56) References Cited

U.S. PATENT DOCUMENTS

| 6,060,752 A * | 5/2000 | Williams ............ H01L 27/0255 257/355 |
| 6,566,715 B1 * | 5/2003 | Ker ..................... H01L 27/0251 257/355 |
| 9,330,979 B2 * | 5/2016 | Levin .............. H01L 21/823462 |
| 2007/0019493 A1 * | 1/2007 | Toba ..................... G11C 5/147 365/226 |

(Continued)

OTHER PUBLICATIONS

Dai, et al. "Investigation on Safe Operating Area and ESD Robustness in a 60-V BCD Process with Different Deep P-Well Test Structures." 2013 IEEE Int. Conf. Microelectronic Test Structures. Mar. 2013.

*Primary Examiner* — Zeev V Kitov
(74) *Attorney, Agent, or Firm* — Eschweiler & Potashnik, LLC

(57) ABSTRACT

The present disclosure relates to an electrostatic discharge (ESD) protection circuit including a dynamic field plate bias circuit, and associated methods. In some embodiments, the ESD protection circuit includes a bipolar junction transistor (BJT) based ESD protection circuit including a field plate configured to increase a breakdown voltage of the BJT based ESD protection circuit. The ESD protection circuit also includes a dynamic field plate bias circuit coupled to the field plate of the BJT based ESD protection circuit. The dynamic field plate bias circuit is configured to provide the field plate a field plate bias at transient opposite to a field plate bias at a normal operation. The transient bias reduces a trigger voltage of the BJT based ESD protection circuit and increases a shunt current of the BJT based ESD protection circuit during the ESD event. Thereby, ESD protection reliability is improved.

20 Claims, 4 Drawing Sheets

(56) References Cited

U.S. PATENT DOCUMENTS

| | | | | |
|---|---|---|---|---|
| 2008/0122519 A1* | 5/2008 | Nowak | ............... | G05F 1/562 327/534 |
| 2013/0126945 A1* | 5/2013 | Liu | ............... | H01L 29/66242 257/197 |
| 2015/0070804 A1* | 3/2015 | de Raad | ............ | H01L 27/0274 361/56 |

* cited by examiner

DYNAMIC ESD PROTECTION SCHEME

REFERENCE TO RELATED APPLICATION

This Application claims priority to U.S. Provisional Application No. 62/343,285 filed on May 31, 2016, the contents of which is hereby incorporated by reference in its entirety.

BACKGROUND

Electrostatic discharge (ESD) is a sudden release of electrostatic charge which can result in high electric fields and currents within an integrated circuit. ESD pulses can damage electronic devices, for example by "blowing out" a gate oxide of a transistor in cases of high voltage or by "melting" an active region area of a device in cases of high current, causing junction failure. If devices are damaged by an ESD pulse, the electronic product can be rendered less operable than desired, or can even be rendered inoperable altogether.

DETAILED DESCRIPTION

Figure 1:
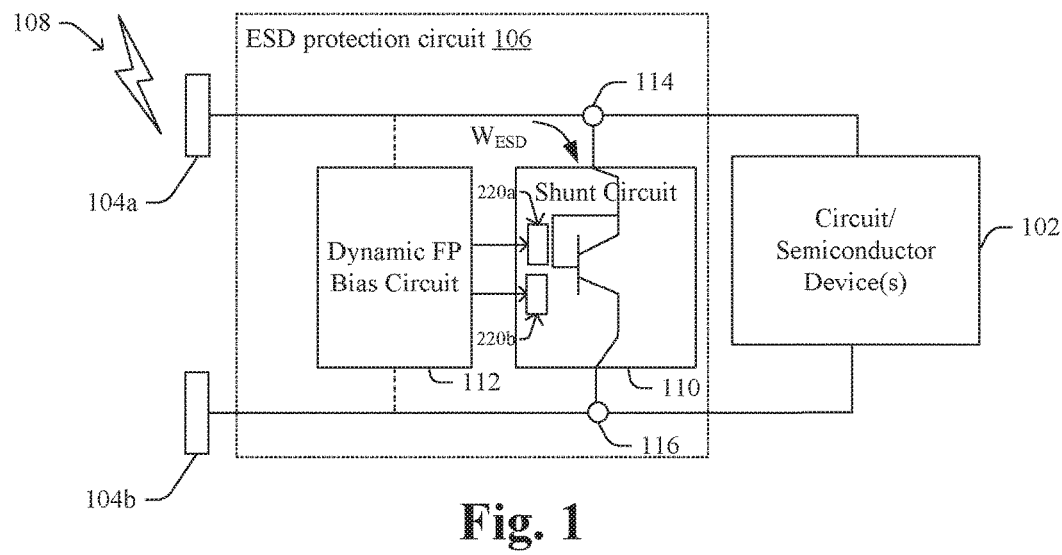
FIG. 1 illustrates a functional block diagram of an ESD protection circuit including a dynamic field plate bias circuit in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

High voltage ICs have become widely used in modern electronic circuits for power management, power distribution, RF ICs, or driver ICs. The high breakdown voltage characteristic of the high voltage devices means that the breakdown voltage (Vb) may be higher than the operating voltage (Vdd), and that the trigger voltage (Vt1) of the ESD protection circuit is also higher than the operating voltage. Accordingly, during an ESD event, the internal circuitry of the high voltage device may be at risk of damage before an ESD protection device is able to turn on and able to shunt an effective amount of current for ESD protection. Thus, electrostatic discharge (ESD) protection in these high voltage technologies may be a challenge.

The present disclosure relates to an electrostatic discharge (ESD) protection circuit including a dynamic field plate bias circuit configured to increase a shunt current of the ESD protection circuit, and associated methods. In some embodiments, the ESD protection circuit comprises a bipolar junction transistor (BJT) based ESD protection circuit including a field plate configured to increase a breakdown voltage of the BJT based ESD protection circuit. The ESD protection circuit further comprises a dynamic field plate bias circuit coupled to the field plate of the BJT based ESD protection circuit. The dynamic field plate bias circuit is configured to provide the field plate a field plate bias at transient opposite to a field plate bias at a normal operation. The transient bias reduces a trigger voltage of the BJT based ESD protection circuit and increases a shunt current of the BJT based ESD protection circuit during the ESD event. Thereby, ESD protection reliability is improved.

FIG. 1 illustrates an integrated circuit (IC) chip 100 including an electrostatic discharge (ESD) protection circuit 106 integrated with a circuit 102 on a semiconductor substrate in accordance with some embodiments. In some embodiments, the circuit 102 may comprise one or more semiconductor devices, which are coupled to an exterior circuit assembly (not shown) via an external IC pin 104. The external IC pin 104 can be a supply pin that supplies a DC supply voltage (e.g., VDD or VSS) to the circuit 102, or can be an input/output (I/O) pin that transfers input or output signals from the circuit 102, for example.

An ESD protection circuit 106 is coupled between the circuit 102 and the external pin 104 to mitigate damage due to an ESD pulse 108. When the circuit 102 is normally operated, a breakdown voltage of the ESD protection circuit 106 is greater than the operation voltage, thus the ESD protection circuit 106 does not interfere with the normal functions of the circuit 102. If an ESD pulse 108 occurs, the ESD protection circuit 106 detects the ESD pulse 108 and shunts the associated energy away from the circuit 102 (e.g., as shown by arrow $W_{ESD}$), thereby preventing damage to the circuit 102.

In some embodiments, the ESD protection circuit 106 comprises a bipolar junction transistor (BJT) based ESD protection circuit 110 configured to selectively shunt a current from the ESD event 108 away from the circuit 102. By shunting the ESD event from away from the circuit 102, the BJT based ESD protection circuit 110 protects the circuit 102 from damage by the ESD event. In some embodiments, the BJT based ESD protection circuit 110 may comprise a PNP bipolar junction transistor, an NPN bipolar junction transistor, or a silicon controlled rectifier (SCR), including one or more field plates to adjust the breakdown voltage and trigger voltage (i.e., the voltage at which the BJT is operated to shunt current) of the BJT based ESD protection circuit 110.

The ESD protection circuit 106 further comprises a dynamic field plate bias circuit 112 configured to control a breakdown voltage of the BJT based ESD protection circuit 110. The dynamic field plate bias circuit 112 may comprise a bias generation circuit having one or more nodes configured to respectively provide biases to the one or more field plates. By biasing the field plates, the breakdown voltage of the BJT can be adjusted. In some embodiments, the dynamic field plate bias circuit 112 may be coupled to the external IC pin 104. In such embodiments, the dynamic field plate bias circuit 112 may generate the biases based upon the ESD event.

The dynamic field plate bias circuit 112 may provide biases at transient opposite to biases at a normal operation. For example, during the normal operation, the dynamic field plate bias circuit 112 may provide a relative high DC bias (e.g. Vdd) to a first field plate and a relative low DC bias (e.g. Vss) to a second field plate, resulting in an increased breakdown voltage of the BJT based ESD protection circuit 110, thereby preventing a latch-up during normal operation. Meanwhile, the dynamic field plate bias circuit 112 may provide opposite transient biases during an ESD event, i.e., a relative low transient bias to the first field plate and a relative high transient bias to the second field plate, resulting in a decreased triggering voltage of the BJT based ESD protection circuit 110, thereby increasing a shunt current of the BJT based ESD protection circuit 110. A relation of the decreased triggering voltage and the increased shunt current is shown in following FIG. 3 and FIG. 6 as examples, which will be explained in later sections.

Figure 2:
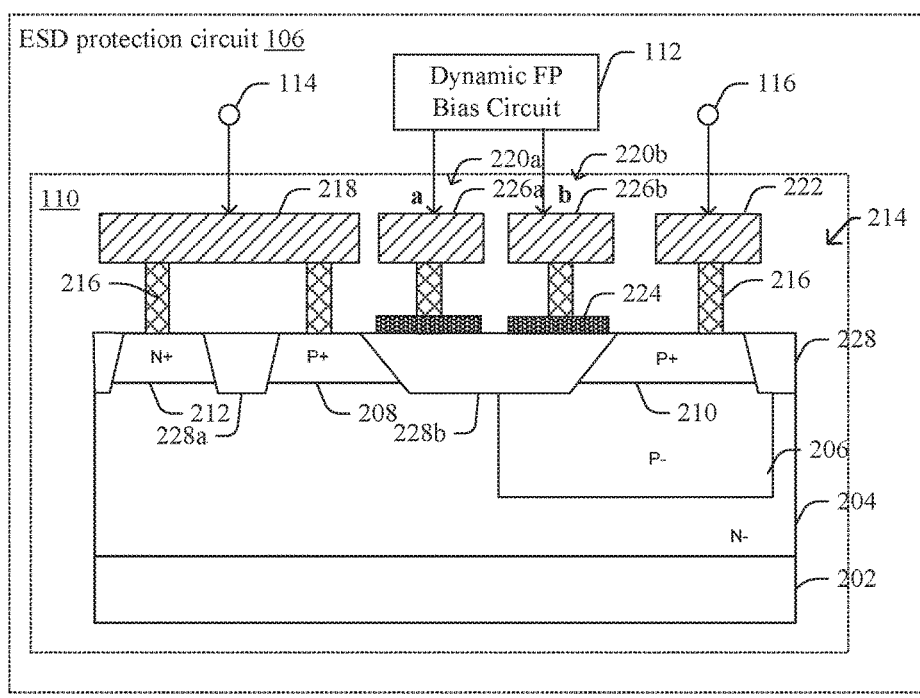
FIG. 2 illustrates a cross-sectional view of an ESD protection circuit coupled to a dynamic field plate bias circuit in accordance with some embodiments.

FIG. 2 illustrates a cross-sectional view 200 of an ESD protection circuit 106 comprising a bipolar junction transistor (BJT) based ESD protection circuit 110 coupled to a dynamic field plate bias circuit 112 in accordance with some embodiments. In various embodiments, the BJT based ESD protection circuit 110 and the dynamic field plate bias circuit 112 can be arranged on separate substrates, or integrated on one substrate 202. In various embodiments, the substrate 202 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

In some embodiments, the BJT based ESD protection circuit 110 comprises an N-type layer 204 disposed over the substrate 202. An N+ doped region 212 and a first P+ doped region 208 may be arranged over the N-type layer 204 and proximate to a top surface of the N-type layer 204. In some embodiments, the N-type layer 204 acts as a base region of a PNP bipolar junction transistor. The first P+ doped region 208 acts as an emitter region of the PNP bipolar junction transistor, and is connected to the base region through the N+ doped region 212. In some embodiments, the N+ doped region 212 and the first P+ doped region 208 are connected to a first metal line 218, so that the base region is electrically coupled to the emitter region. The first metal line 218 may act as or be coupled to an emitter contact of the PNP bipolar junction transistor. A P-type well 206 can be disposed adjacent to the N-type layer 204, acting as a collector region of the PNP bipolar junction transistor. The P-type well 206 is connected to a second metal line 222 through a second P+ doped region 210. The second metal line 222 may act as or be coupled to a collector contact of the PNP bipolar junction transistor. The N+ doped region 212, the first P+ doped region 208 and the second P+ doped region 210 may be separated one from another in lateral by a plurality of field oxide regions 228.

One or more field plates 220 (e.g. 220a, 220b) may be disposed over the BJT based ESD protection circuit 110. The field plates 220 (e.g. 220a, 220b) are configured to adjust the breakdown voltage and trigger voltage of the BJT based ESD protection circuit 110. As an example, the first field plate 220a is disposed overlying the N-type layer 204, and a second field plate 220b is disposed overlying the P-type well 206. The first field plate 220a and the second field plate 220b may be separated from the N-type layer 204 or the P-type well 206 by the field oxide regions 228. In some embodiments, the field plates 220a and 220b are disposed adjacent to, e.g., on top of, the field oxide regions 228 and between the first P+ doped region 208 and the second P+ doped region 210. In some embodiments, the first and second field plates 220a, 220b may respectively include polysilicon layers 224 on top surfaces of the field oxide regions 228 and connected to a third metal line 226a and a fourth metal line 226b. In some embodiments, some of the metal lines 218, 226a, 226b, and 222 are aligned and arranged within one metal layer, for example, a metal layer 214, and connected to corresponding doping regions through contact vias 216.

In some alternative embodiments, the polysilicon layers 224 are absent and planar metal bodies, i.e., the third metal line 226a and the fourth metal line 226b act as field plates that are separated from the N-type layer 204 or the P-type well 206 by an inter-layer dielectric layer. In some further alternative embodiments, either of the first field plate 220a and the second field plate 220b is presented while the other of the first field plate 220a and the second field plate 220b is absent. In various embodiments, the field plates 220 may have various lengths selected based upon a desired breakdown voltage and trigger voltage. In some embodiments, the lengths of one or more of the field plates 220 may be adjusted during manufacture to adjust the breakdown voltage and trigger voltage of the BJT based ESD protection circuit 110.

During the operation, the ESD protection circuit 106 is coupled to a first circuit node and a second circuit node of a circuit and to protect the circuit from an ESD event, as described in FIG. 1. As an example, an anode (e.g. a force node Vdd) may be operably connected to the first metal line 218, and a cathode (e.g. a ground node Vss) may be operably connected to the second metal line 222. When the circuit is normally operated, substantially no current passes through the ESD protection circuit 106. The dynamic field plate bias circuit 112 provides dynamic biases to the field plates 220a, 220b. A relative low DC bias (e.g. the ground node Vss) is applied to the first field plate 220a, and a relative high DC bias (e.g. the force node Vdd) can be applied to the second field plate 220b. The biased field plates 220a, 220b redistribute depletion regions between the N-type layer 204 and the P-type well 206 to be further from a top surface or a drain edge, such that a breakdown voltage of the BJT based ESD protection circuit 110 is increased, thereby not mistakenly turning on the BJT based ESD protection circuit 110 by noises or signal peaks. Meanwhile, the dynamic field plate bias circuit 112 may provide opposite transient biases: a relative high transient bias (e.g. the force node Vdd) is applied to the first field plate 220a, and a relative low transient bias (e.g. the ground node Vss) is applied to the second field plate 220b. If an ESD pulse occurs, the transient biases result in a decreased triggering voltage of the BJT based ESD protection circuit 110, thereby increasing a shunt current of the BJT based ESD protection circuit 110.

Figure 3:
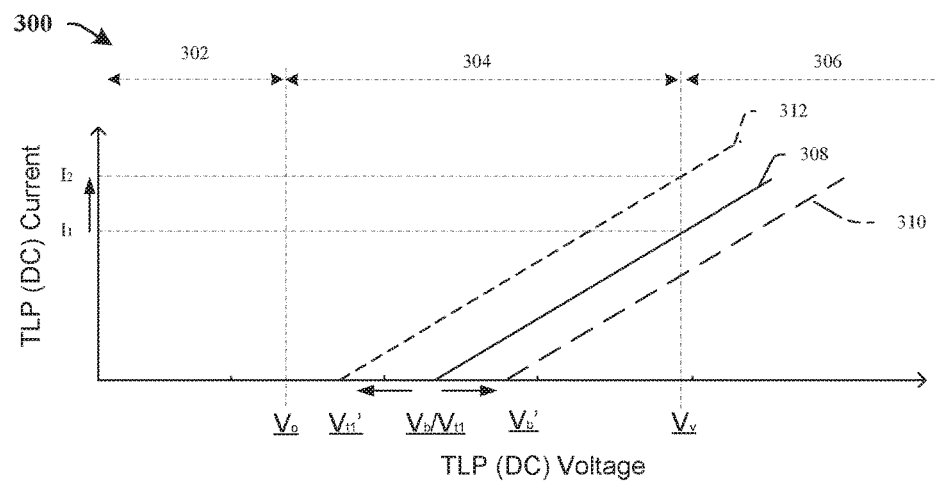
FIG. 3 illustrates a graph showing protection current behaviors of the ESD protection circuit of FIG. 1 in response to a transmission line pulse (TLP) voltage in accordance with some embodiments.

FIG. 3 illustrates a graph 300 showing protection current behaviors of the ESD protection circuit 110 of FIG. 1 in response to a transmission line pulse (TLP) voltage in accordance with some embodiments. TLP current (y axis) represents the ESD shunt ability of the ESD protection circuit 106. For example, a greater TLP current corresponds to a stronger ESD shunt ability (i.e., a greater TLP current means the ESD Protection circuit can shunt more energy). Three TLP voltage regions are shown in FIG. 3. In a first range 302, where the TLP voltage is smaller than an operation voltage Vo, the circuit 102 is normally operated and the ESD protection circuit 106 is not triggered and does not interfere with the normal functions of the circuit 102 (i.e., the TLP current is zero since no energy is shunted by the ESD protection circuit). In some embodiments, the operation voltage Vo is slightly higher than the force voltage (e.g., Vdd). For example, the operation voltage Vo can be about 1.1×Vdd. A second range 304 is the working region of the BJT based ESD protection circuit 110, where the TLP voltage is greater than the operation voltage Vo but smaller than a victim voltage Vv (i.e., a voltage at which damage occurs to an ESD susceptible circuit). The circuit 102 is subjected to be damaged in a third range 306, where the TLP voltage is greater than the victim voltage Vv.

A solid line 308 shows a TLP current response over a TLP voltage without interference of the field plate. The BJT based ESD protection circuit 110 is triggered when the TLP voltage is greater than a trigger voltage Vt1, which is substantially equal to a breakdown voltage Vb. A first TLP current level I1 is reached when the TLP voltage is around the victim voltage Vv. A long-dashed line 310 shows a DC current response over a DC voltage when applying a DC bias to the field plate. The DC bias applied to the field plate results in a breakdown voltage Vb shifted to be a greater Vb', thereby reducing lock-up issues. A short-dashed line 312 shows a TLP current response over a TLP voltage when applying an opposite transient bias to the field plate. The opposite transient bias applied to the field plate results in a triggering voltage Vt1 shifted to be a smaller Vt1', thereby increasing a TLP current to a second TLP current I2 greater than the first TLP current level I1 when the TLP voltage is around the victim voltage Vv (i.e., increasing the energy is shunted by the ESD protection circuit).

Figure 4:
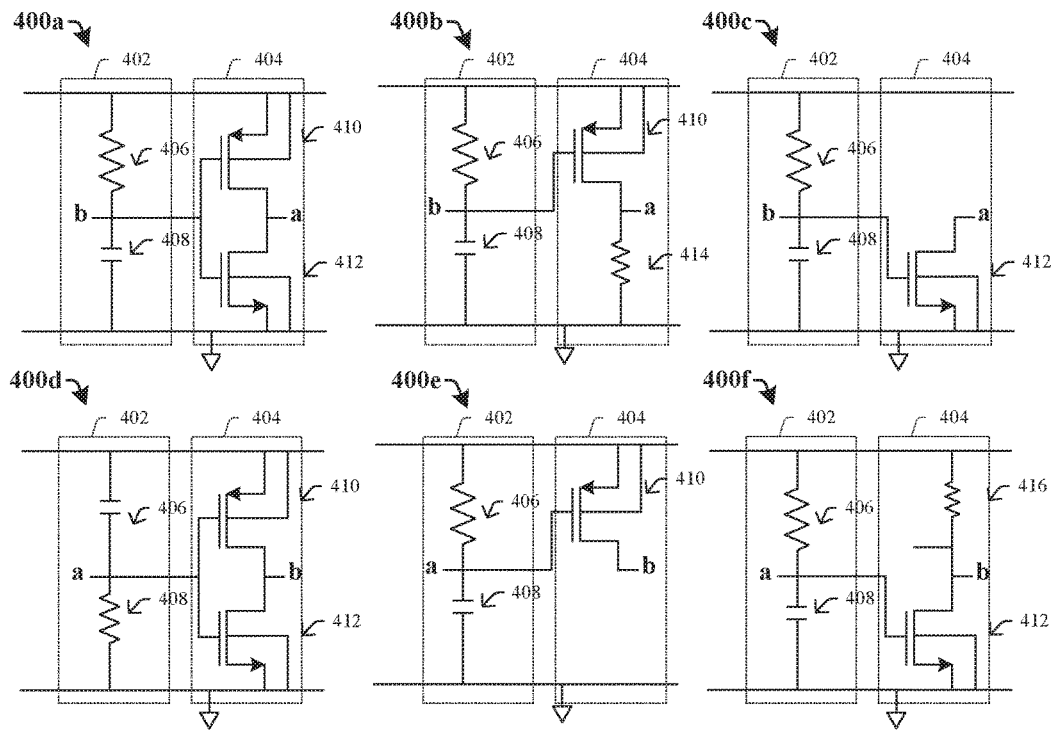
FIG. 4 illustrates a circuit schematic of the dynamic field plate bias circuit of the ESD protection circuit of FIG. 1 in accordance with some embodiments.

FIG. 4 illustrates a circuit schematic of the dynamic field plate bias circuit 112 of the ESD protection circuit 106 of FIG. 1 in accordance with some embodiments. It is appreciated that though circuit schematics 400a-400f are provided as examples, various circuit schematics can be applied to provide dynamic biases for the field plates 220 (e.g. 220a, 220b) of the BJT based ESD protection circuit 110. As respectively shown in the circuit schematics 400a-400f, the dynamic field plate bias circuit 112 may comprise a bias generation circuit 402 including a first bias node a (in 400d-400f) or a second bias node b (in 400a-400c) and an inverting circuit 404 including the second bias node b (in 400d-400f) or the first bias node a (in 400a-400c). In some embodiments, the bias generation circuit 402 comprises a resister 406 and a capacitor 408 connected in series. The first bias node a (in 400d-400f) or the second bias node b (in 400a-400c) is arranged between the resister 406 and the capacitor 408. The first bias node a is connected to a first field plate (e.g. the first field plate 220a shown in FIG. 2), and is configured to provide a relative low bias at normal and a relative high bias or float status at transient. The second bias node b is connected to a second field plate (e.g. the second field plate 220b shown in FIG. 2), and is configured to provide a relative high bias at normal and a relative low bias or float status at transient.

For example, as shown in circuit schematic 400a, during normal operation (i.e., in the absence of an EDS event) capacitive element 408 acts as an open and provides a high voltage to node b. The high voltage is inverted by the inverting element 404 so as to provide a low voltage at node a. If an ESD event is present, bias generation circuit 402 has a RC time constant delay defined by the resister 406 and the capacitor 408, during which the bias generation circuit 402 provides a low voltage to node b. The low voltage is inverted by inverting element 404, so that node a is biased with a relatively high voltage before the RC time constant is reached. The biases are provided to the field plates, thereby biasing the field plates in a manner that decreases the triggering voltage during the ESD event.

As shown in the circuit schematic 400a, the inverting circuit 404 may comprise a PMOS transistor 410 and an NMOS transistor 412 connected in series, having gates shorted and controlled by the second bias node b (in 400a-400c) or the first bias node a (in 400d-400f). As shown in the circuit schematic 400b, the inverting circuit 404 may alternatively comprise a PMOS transistor 410 and a resistor 414 connected in series. As shown in the circuit schematic 400c, the inverting circuit 404 may alternatively comprise an NMOS transistor 412. As shown in the circuit schematic 400d, the inverting circuit 404 may alternatively comprise a PMOS transistor 410 and an NMOS transistor 412 connected in series. As shown in the circuit schematic 400e, the inverting circuit 404 may alternatively comprise a PMOS transistor 410. As shown in the circuit schematic 400f, the inverting circuit 404 may alternatively comprise a resistor 416 and an NMOS transistor 412 connected in series.

Notably, in various embodiments of FIG. 4, the first bias node a and the second bias node b are illustrated corresponding to the first field plate 220a and the second field plate 220b of FIG. 2. However, corresponding to what is discussed above that either of the first field plate 220a and the second field plate 220b can be absent in varies design options, the triggering circuit 402 may stand alone to provide one dynamic bias to the first field plate 220a or the second field plate 220b, whichever is applied.

It is appreciated that although a PNP bipolar junction transistor structure is described as an example of the BJT based ESD protection circuit in FIGS. 2-4, an NPN bipolar junction transistor, which may have doping types opposite to what are illustrated above for each of the components, is also amenable in some embodiments. An example of the NPN bipolar junction transistor is illustrated in FIGS. 5-6.

Figure 5:
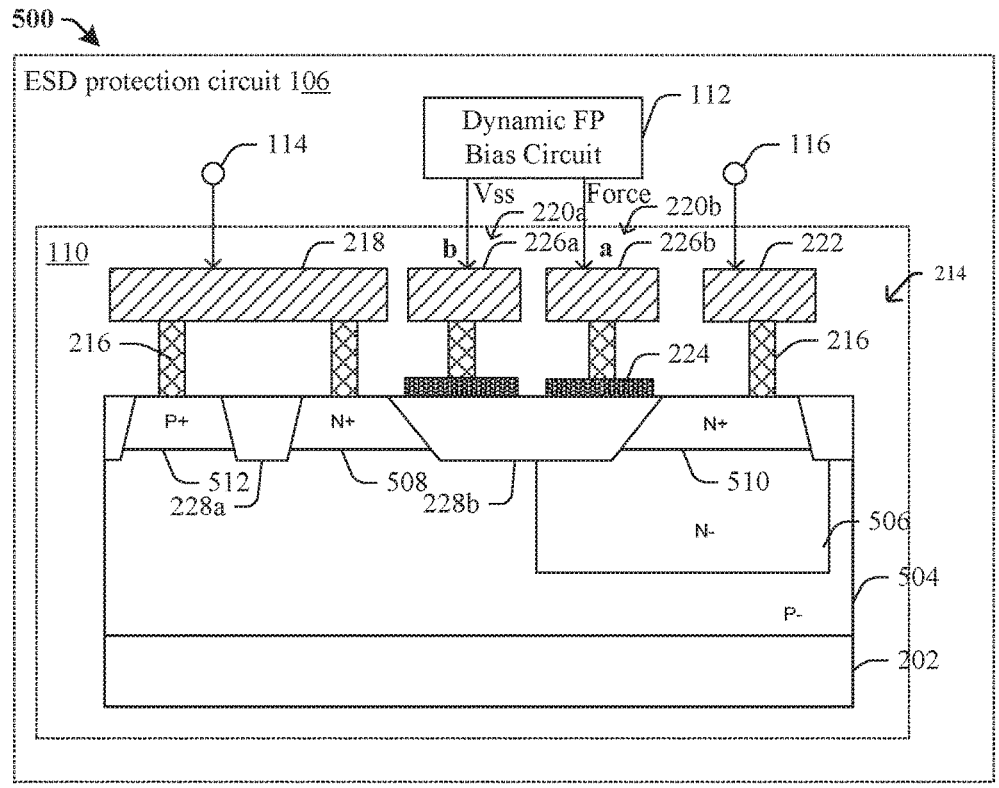
FIG. 5 illustrates a cross-sectional view of an ESD protection circuit coupled to a dynamic field plate bias circuit in accordance with some alternative embodiments.

As shown in FIG. 5, the BJT based ESD protection circuit 110 comprises a P-type layer 504 disposed over the substrate 202. A P+ doped region 512 and a first N+ doped region 508 may be arranged over the P-type layer 504 and proximate to a top surface of the P-type layer 504. In some embodiments, the P-type layer 504 acts as a base region of a NPN bipolar junction transistor. The first N+ doped region 508 acts as an emitter region of the NPN bipolar junction transistor, and is connected to the base region through the P+ doped region 512. In some embodiments, the P+ doped region 512 and the first N+ doped region 508 are connected to a first metal line 218. A N-type well 506 can be disposed adjacent to the P-type layer 504, acting as a collector region of the NPN bipolar junction transistor. The N-type well 506 is connected to a second metal line 222 through a second N+ doped region 510. The P+ doped region 512, the first N+ doped region 508 and the second N+ doped region 510 may be separated one from another in lateral by a plurality of field oxide regions 228 (228b, 228b). A first field plate 220a may be disposed overlying the P-type layer 504, and a second field plate 220b is disposed overlying the N-type well 506. In some embodiments, the first and second field plates 220a, 220b may respectively include polysilicon layers 224 on top surfaces of the field oxide regions 228 and connected to a third metal line 226a and a fourth metal line 226b. In some embodiments, some of the metal lines 218, 226a, 226b, and 222 are aligned and arranged within one metal layer, for example, a metal layer 214, and connected to corresponding doping regions through contact vias 216.

Figure 6:
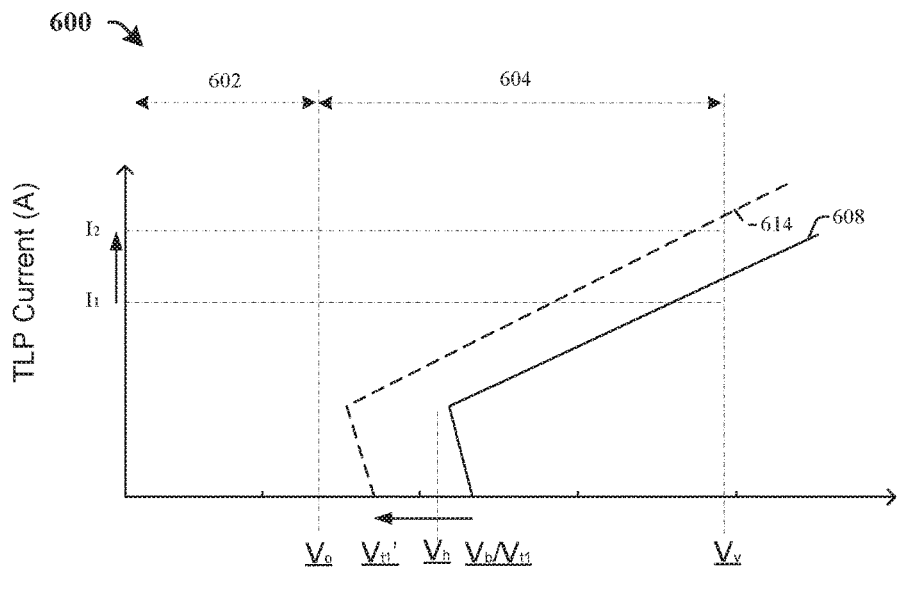
FIG. 6 illustrates a graph showing protection current behaviors of the ESD protection circuit of FIG. 5 in response to a transmission line pulse (TLP) voltage in accordance with some alternative embodiments.

As shown in FIG. 6, a graph 600 shows protection current behaviors of the NPN bipolar junction transistor of FIG. 5 in response to a transmission line pulse (TLP) voltage in accordance with some alternative embodiments. A greater TLP current (y axis) corresponds to a stronger ESD shunt ability. The circuit 102 is normally operated and the ESD protection circuit 106 is not triggered and does not interfere with the normal functions of the circuit 102 in a first range 602 where the TLP voltage is smaller than an operation voltage Vo. The BJT based ESD protection circuit 110 works in a second range 604 where the TLP voltage is greater than the operation voltage Vo but smaller than a victim voltage Vv. A solid line 608 shows a TLP current response over a TLP voltage without interference of the field plate. The BJT based ESD protection circuit 110 is triggered when the TLP voltage is greater than a trigger voltage Vt1, which is substantially equal to a breakdown voltage Vb. The TLP voltage is then snapped back to a holding voltage Vh. A first TLP current level I1 is reached when the TLP voltage is around the victim voltage Vv. A short-dashed line 612 shows a TLP current response over a TLP voltage when applying a bias to the field plate. The transient biases applied to the field plate results in a triggering voltage Vt1 shift to be a smaller Vt1', thereby increasing a TLP current to a second TLP current I2 greater than the first TLP current level I1 when the TLP voltage is around the victim voltage Vv.

Compared to the NPN bipolar junction transistor, the PNP bipolar junction transistor provides a weak snapback ESD protection, thereby reducing latch up issues because of a high holding voltage. This high holding voltage creates a potential risk that the BJT based ESD protection circuit may remain in a conducting or shorted state under powered up normal operating conditions, which can result in a device malfunction and/or the destruction of the BJT based ESD protection circuit.

Figure 7:
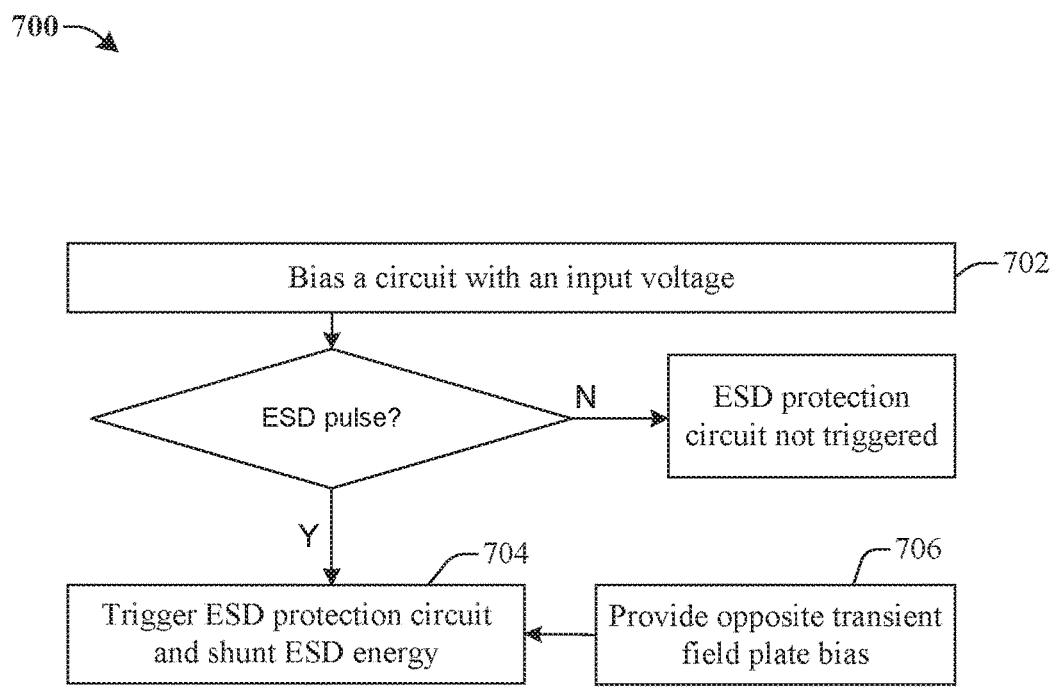
FIG. 7 illustrates a flow diagram illustrating a method of protecting a circuit during an ESD event in accordance with some embodiments.

FIG. 7 illustrates a flow diagram illustrating a method 700 of protecting a circuit during an ESD event in accordance with some embodiments. The method 700 triggers an ESD protection path when an ESD pulse strikes a circuit and an input voltage exceeds a trigger threshold. The ESD protection path is controlled by a field plate bias having a transient field plate bias opposite to a bias at the normal operation to transiently increase a shunt current of the ESD shunt path to shunt energy of the ESD pulse.

At block 702, a circuit or a semiconductor device is biased with an input voltage. If the input voltage is around a desired operation gate voltage or within a maximum strike value allowed, the ESD protection path is not triggered. In some embodiments, a DC field plate bias may be applied during biasing of the circuit or semiconductor device. The first range 302 in FIG. 3 shows an example of this operation state.

At block 704, an ESD pulse strikes the circuit and the ESD protection path is triggered when the input voltage is greater than a trigger voltage. Some shunt current passes through the ESD shunt path to shunt energy of the ESD pulse. The second range 304 in FIG. 3 shows an example of this operation state and the solid line 308 shows an example current response of the operation state.

At block 706, a dynamic field plate bias interferes the ESD protection path and increases a shunt current of the ESD shunt path. A transient field plate bias opposite to a DC field plate bias is applied to transiently increase a shunt current of the ESD shunt path to shunt energy of the ESD pulse. The short-dashed line 312 in FIG. 3 shows an example TLP current response affected by the dynamic field plate bias.

It will be appreciated that while reference is made throughout this document to exemplary structures in discussing aspects of methodologies described herein (e.g., the structure presented in FIG. 2, while discussing the example set forth in FIG. 3 and FIG. 4), that those methodologies are not to be limited by the corresponding structures presented. Rather, the methodologies (and structures) are to be considered independent of one another and able to stand alone and be practiced without regard to any of the particular aspects depicted in the Figures.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular function block, it will be appreciated that alternative separate blocks may be utilized as will be appreciated by one of ordinary skill in the art.

Thus, the present disclosure relates to an electrostatic discharge (ESD) protection circuit including a dynamic field plate bias circuit, and associated methods.

In some embodiments, the present disclosure relates to an electrostatic discharge (ESD) protection circuit to protect a circuit from an ESD event. The ESD protection circuit comprises a bipolar junction transistor (BJT) based ESD protection circuit including a field plate overlying a base region of the BJT based ESD protection circuit. The ESD protection circuit further comprises a dynamic field plate bias circuit coupled to the field plate of the BJT based ESD protection circuit and configured to provide the field plate a field plate bias at transient opposite to a field plate bias at a normal operation.

In some other embodiments, the present disclosure relates to an electrostatic discharge (ESD) protection circuit to protect a circuit from an ESD event. The ESD protection circuit comprises an ESD shunt path coupled to first and second circuit nodes of the circuit and shunt energy of an incoming ESD pulse from the first circuit node to the second circuit node and away from a semiconductor device to be protected on the circuit. The ESD protection circuit further comprises a dynamic field plate bias circuit configured to transiently reduce a trigger voltage of the ESD shunt path and increase a shunt current of the ESD shunt path during the ESD event.

Still in some other embodiments, the present disclosure relates to a method of electrostatic discharge (ESD) protection in a circuit. The method comprises biasing a circuit with an input voltage. An ESD pulse striks the circuit from the input voltage. The method further comprises triggering a ESD protection path in response to the ESD pulse when the input voltage is greater than a trigger voltage. The method further comprises providing a transient field plate bias opposite to a DC field plate bias to transiently increase a shunt current of the ESD protection path to shunt energy of the ESD pulse.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An electrostatic discharge (ESD) protection circuit to protect a circuit from an ESD event, the ESD protection circuit comprising:
   a bipolar junction transistor (BJT) based ESD protection circuit including a field plate overlying a base region of the BJT based ESD protection circuit; and
   a dynamic field plate bias circuit coupled to the field plate of the BJT based ESD protection circuit and configured to provide the field plate a field plate bias at transient different from a field plate bias at a normal operation.

2. The ESD protection circuit of claim 1, wherein the transient bias reduces a trigger voltage and increases a shunt current of the BJT based ESD protection circuit during the ESD event.

3. The ESD protection circuit of claim 1, the BJT based ESD protection circuit comprising:
   an N-type layer disposed over a substrate;
   an N+ doped region and a first P+ doped region disposed proximate to a top surface of the N-type layer and separated one from another by a first field oxide region; and
   a P-type well disposed adjacent to the N-type layer.

4. The ESD protection circuit of claim 3, the BJT based ESD protection circuit further comprising:
   a second P+ doped region disposed proximate to a top surface of the P-type well and separated from the first P+ doped region by a second field oxide region.

5. The ESD protection circuit of claim 4, the BJT based ESD protection circuit further comprising:
   a first field plate overlying the N-type layer and configured to receive a relative low DC bias; and
   a second field plate overlying the P-type well and configured to receive a relative high DC bias.

6. The ESD protection circuit of claim 5,
   wherein the first field plate is further configured to receive a relative high transient bias provided by the dynamic field plate bias circuit; and
   wherein the second field plate is further configured to receive a relative low transient bias provided by the dynamic field plate bias circuit.

7. The ESD protection circuit of claim 1, wherein the field plate comprises a polysilicon layer disposed on a field oxide region and coupled to a metal line through a via contact.

8. The ESD protection circuit of claim 1, wherein the field plate comprises a metal line separated from a field oxide region.

9. The ESD protection circuit of claim 1, the dynamic field plate bias circuit comprising:
   a bias generation circuit including a first bias node configured to provide a relative high bias at a normal operation and a relative low bias or float status at transient.

10. The ESD protection circuit of claim 9, the dynamic field plate bias circuit further comprising:
    an inverting circuit including a second bias node configured to provide a relative low bias at a normal operation and a relative high bias or float status at transient.

11. The ESD protection circuit of claim 10,
    wherein the bias generation circuit comprises a resister and a capacitor in series; and
    wherein the invert circuit comprises a PMOS transistor and an NMOS transistor in series and having gates shorted and connected to the first node of the bias generation circuit.

12. The ESD protection circuit of claim 1, the BJT based ESD protection circuit comprising:
    an P-type layer disposed over a substrate;
    an P+ doped region and a first N+ doped region disposed proximate to a top surface of the P-type layer and separated one from another by a first field oxide region;
    a N-type well disposed adjacent to the P-type layer; and
    a second N+ doped region disposed proximate to a top surface of the N-type well and separated from the first N+ doped region by a second field oxide region.

13. The ESD protection circuit of claim 12, the dynamic field plate bias circuit comprising:
    a trigger circuit including a first bias node connected to a first field plate overlying the P-type layer, and configured to provide a relative high bias at a normal operation and a relative low bias or float status at transient; and
    an inverting circuit including a second bias node connected to a second field plate overlying the N-type well, and configured to provide a relative low bias at the normal operation and a relative high bias or float status at transient.

14. An electrostatic discharge (ESD) protection circuit, comprising:
    an electrostatic discharge (ESD) susceptible circuit electrically connected to a first circuit node having a first voltage and a second circuit node having a second voltage;
    an ESD shunt path comprising a BJT based ESD protection circuit including a base region and an emitter region electrically connected and a field plate separated from the base region and the emitter region by a field oxide region, wherein the BJT based ESD protection circuit is coupled between the first and second circuit nodes and configured to shunt energy of an incoming ESD pulse from the first circuit node to the second circuit node and away from the ESD susceptible circuit; and
    a dynamic field plate bias circuit configured to bias the field plate to reduce a trigger voltage of the ESD shunt path and to increase a shunt current of the ESD shunt path during an ESD event.

15. The ESD protection circuit of claim 14, wherein the ESD shunt path comprises a PNP bipolar junction transistor (BJT) based ESD protection circuit.

16. The ESD protection circuit of claim 15, wherein the field plate comprises a planar metal body aligned with an emitter contact and a collector contact of the PNP BJT based ESD protection circuit.

17. The ESD protection circuit of claim 16, wherein the field plate is disposed between the emitter contact and the collector contact of the PNP BJT based ESD protection circuit.

18. The ESD protection circuit of claim 14, wherein the dynamic field plate bias circuit comprises a bias generation circuit and has a first bias node between a resistor and a capacitor connected to a first field plate, the first bias node configured to provide a relative low DC bias and a relative high bias or float status at transient.

19. The ESD protection circuit of claim 18, wherein the dynamic field plate bias circuit further comprises an invert circuit controlled by the first bias node and including a second bias node connected to a second field plate, the second bias node configured to provide a relative high DC bias and a relative low bias or float status at transient.

20. A method of electrostatic discharge (ESD) protection in a circuit, the method comprising:
- providing an input bias to a circuit, wherein the input bias includes an ESD pulse striking the circuit;
- triggering a ESD protection path in response to the ESD pulse when the input bias is greater than a trigger voltage; and
- providing a transient field plate bias between a first field plate and a second field plate of an ESD protection circuit of the ESD protection path opposite to a DC field plate bias to transiently increase a shunt current of the ESD protection path to shunt energy of the ESD pulse.

* * * * *